(12) United States Patent
Tuckerman

(10) Patent No.: US 11,211,722 B2
(45) Date of Patent: Dec. 28, 2021

(54) SUPERCONDUCTOR INTERCONNECT SYSTEM

(71) Applicant: Microsoft Technology Licensing, LLC, Redmond, WA (US)

(72) Inventor: David B. Tuckerman, Lafayette, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 204 days.

(21) Appl. No.: 15/915,976

(22) Filed: Mar. 8, 2018

(65) Prior Publication Data

US 2018/0261932 A1 Sep. 13, 2018

Related U.S. Application Data

(60) Provisional application No. 62/469,400, filed on Mar. 9, 2017.

(51) Int. Cl.
*H01R 4/68* (2006.01)
*H01R 4/38* (2006.01)
(Continued)

(52) U.S. Cl.
CPC ............... *H01R 4/68* (2013.01); *H01L 39/02* (2013.01); *H01L 39/2406* (2013.01); *H01R 4/38* (2013.01); *H01R 4/48* (2013.01); *H01R 43/26* (2013.01)

(58) Field of Classification Search
CPC .. H01R 4/68; H01R 4/38; H01R 43/26; H01L 39/02; H01L 39/2406
See application file for complete search history.

(56) References Cited

U.S. PATENT DOCUMENTS 3,341,380 A 9/1967 Mcts
4,117,354 A 9/1978 Geewala
(Continued)

FOREIGN PATENT DOCUMENTS

EP 0467104 1/1992
EP 3217336 9/2017
(Continued)

OTHER PUBLICATIONS

Korean Office Action corresponding to Korean Application No. 10-2018-7013489 dated Mar. 28, 2019.
(Continued)

*Primary Examiner* — Timor Karimy
(74) *Attorney, Agent, or Firm* — Ranjeev Singh; Singh Law, PLLC

(57) ABSTRACT

One embodiment includes a computer interconnect system. The system includes a first cable comprising a first superconducting signal line formed from a superconductor material to propagate at least one signal and a second cable comprising a second superconducting signal line formed from the superconductor material to propagate the respective at least one signal. The system also includes an interconnect structure configured to contact each of the first and second cable and comprising a third superconducting signal line formed from the superconductor material and configured to propagate the respective at least one signal between the respective first and second superconducting signal line. The system further includes at least one interconnect contact disposed on the first, second, and third at least one superconducting signal line at a contact portion between each of the at least one first and third superconducting signal lines and the at least second and third superconducting signal lines.

16 Claims, 8 Drawing Sheets

(51) Int. Cl.
  *H01L 39/02* (2006.01)
  *H01R 43/26* (2006.01)
  *H01R 4/48* (2006.01)
  *H01L 39/24* (2006.01)

(56) References Cited

U.S. PATENT DOCUMENTS

| | | |
|---|---|---|
| 4,132,956 A | 1/1979 | Russer |
| 4,149,097 A | 4/1979 | Faris |
| 4,274,015 A | 6/1981 | Faris |
| 4,360,898 A | 11/1982 | Faris |
| 4,916,335 A | 4/1990 | Goto |
| 5,051,627 A | 9/1991 | Schneier |
| 5,099,152 A | 3/1992 | Suzuki |
| 5,309,038 A | 5/1994 | Harada |
| 5,942,950 A | 8/1999 | Merenda |
| 6,184,477 B1* | 2/2001 | Tanahashi ............... H01L 23/50 |
| | | 174/261 |
| 6,188,236 B1 | 2/2001 | Wikborg |
| 6,486,756 B2 | 11/2002 | Tarutani |
| 6,507,234 B1 | 1/2003 | Johnson |
| 6,518,786 B2 | 2/2003 | Herr |
| 6,549,059 B1 | 4/2003 | Johnson |
| 6,617,643 B1 | 9/2003 | Goodwin-Johansson |
| 6,724,216 B2 | 4/2004 | Suzuki |
| 6,750,794 B1 | 6/2004 | Durand |
| 6,865,639 B2 | 3/2005 | Herr |
| 6,897,468 B2 | 5/2005 | Blais |
| 6,960,780 B2 | 11/2005 | Blais |
| 6,960,929 B2 | 11/2005 | Bedard |
| 7,129,870 B2 | 10/2006 | Hirano |
| 7,212,070 B2 | 5/2007 | Westwick et al. |
| 7,498,832 B2 | 3/2009 | Baumgardner |
| 7,613,765 B1 | 11/2009 | Hilton |
| 7,714,605 B2 | 5/2010 | Baumgardner |
| 7,724,020 B2 | 5/2010 | Herr |
| 7,772,871 B2 | 8/2010 | Herr |
| 7,772,872 B2 | 8/2010 | Lewis |
| 7,782,077 B2 | 8/2010 | Herr |
| 7,969,178 B2 | 6/2011 | Przybysz et al. |
| 7,977,964 B2 | 7/2011 | Herr |
| 8,022,722 B1 | 9/2011 | Pesetski |
| 8,111,083 B1 | 2/2012 | Pesetski |
| 8,138,784 B2 | 3/2012 | Przybysz et al. |
| 8,508,280 B2 | 8/2013 | Naaman |
| 8,610,453 B2 | 12/2013 | Herr |
| 8,654,578 B2 | 2/2014 | Lewis et al. |
| 8,975,912 B2 | 3/2015 | Chow |
| 9,000,621 B2 | 4/2015 | Ichikawa |
| 9,208,861 B2 | 12/2015 | Herr |
| 9,281,057 B1 | 3/2016 | Herr |
| 9,501,748 B2 | 11/2016 | Naaman et al. |
| 9,735,776 B1 | 8/2017 | Abdo |
| 9,787,312 B2 | 10/2017 | Herr et al. |
| 10,122,350 B2 | 11/2018 | Miller et al. |
| 10,122,351 B1 | 11/2018 | Naaman et al. |
| 10,122,352 B1 | 11/2018 | Miller et al. |
| 10,236,869 B2 | 3/2019 | Herr et al. |
| 10,355,677 B1 | 7/2019 | Miller et al. |
| 10,389,336 B1 | 8/2019 | Miller et al. |
| 10,491,178 B2 | 11/2019 | Naaman et al. |
| 10,622,977 B2 | 4/2020 | Naaman et al. |
| 2002/0063643 A1 | 5/2002 | Smith |
| 2002/0190381 A1 | 12/2002 | Herr |
| 2003/0011398 A1 | 1/2003 | Herr |
| 2003/0016069 A1 | 1/2003 | Furuta |
| 2003/0039138 A1 | 2/2003 | Herr |
| 2003/0040440 A1 | 2/2003 | Wire |
| 2003/0115401 A1 | 6/2003 | Herr |
| 2003/0183935 A1 | 10/2003 | Herr |
| 2003/0207766 A1 | 11/2003 | Esteve et al. |
| 2004/0120444 A1 | 6/2004 | Herr |
| 2004/0201099 A1 | 10/2004 | Herr |
| 2004/0201400 A1 | 10/2004 | Herr |

| | | |
|---|---|---|
| 2004/0266209 A1* | 12/2004 | Hinode ............ H01L 21/31055 |
| | | 438/737 |
| 2005/0001209 A1 | 1/2005 | Hilton et al. |
| 2005/0023518 A1 | 2/2005 | Herr |
| 2005/0078022 A1 | 4/2005 | Hirano et al. |
| 2005/0098773 A1 | 5/2005 | Vion et al. |
| 2005/0110106 A1 | 5/2005 | Goto |
| 2005/0117244 A1 | 6/2005 | Ranmuthu |
| 2005/0224784 A1 | 10/2005 | Amin |
| 2005/0231196 A1 | 10/2005 | Tarutani |
| 2006/0091490 A1 | 5/2006 | Chen |
| 2006/0255987 A1 | 11/2006 | Nagasawa et al. |
| 2007/0052441 A1 | 3/2007 | Taguchi |
| 2009/0082209 A1 | 3/2009 | Bunyk |
| 2009/0084991 A1 | 4/2009 | Ichimura |
| 2009/0153180 A1 | 6/2009 | Herr |
| 2009/0289638 A1 | 11/2009 | Farinelli |
| 2009/0322374 A1 | 12/2009 | Przybysz |
| 2011/0175062 A1 | 7/2011 | Farinelli |
| 2011/0180779 A1* | 7/2011 | Han ................ B82Y 20/00 |
| | | 257/13 |
| 2012/0094838 A1 | 4/2012 | Bunyk |
| 2013/0015885 A1 | 1/2013 | Naaman |
| 2013/0043945 A1 | 2/2013 | McDermott et al. |
| 2013/0135785 A1* | 5/2013 | Kim ................ H01G 5/16 |
| | | 361/278 |
| 2015/0092465 A1 | 4/2015 | Herr |
| 2015/0254571 A1 | 9/2015 | Miller et al. |
| 2015/0263260 A1* | 9/2015 | Thom ............... H01R 12/50 |
| | | 505/210 |
| 2017/0085231 A1 | 3/2017 | Baleegh |
| 2017/0141769 A1 | 5/2017 | Miller et al. |
| 2018/0261932 A1 | 9/2018 | Tuckerman |

FOREIGN PATENT DOCUMENTS

| | | |
|---|---|---|
| EP | 3217336 A1 | 9/2017 |
| EP | 3378162 A1 | 9/2018 |
| JP | S6192036 | 5/1986 |
| JP | 2000268579 A | 9/2000 |
| JP | 2001345488 | 12/2001 |
| JP | 2004080129 A | 3/2004 |
| JP | 2005188947 A | 7/2005 |
| JP | 2005527902 A | 9/2005 |
| JP | 2006270282 A | 10/2006 |
| JP | 2009225213 A | 10/2009 |
| JP | 2011530870 A | 12/2011 |
| JP | 2013058998 A | 3/2013 |
| JP | 5835377 B2 | 12/2015 |
| JP | 6192036 B2 | 9/2017 |
| WO | 199808307 | 2/1998 |
| WO | 2003090162 | 10/2003 |
| WO | 2005093649 | 10/2005 |
| WO | 2008050864 | 5/2008 |
| WO | 2009157532 | 12/2009 |
| WO | 2010028183 | 3/2010 |
| WO | 2015050622 A1 | 4/2015 |
| WO | 2016127021 | 8/2016 |
| WO | 2017087070 A1 | 5/2017 |

OTHER PUBLICATIONS

Canadian Office Action corresponding to Canadian Patent Application No. 3003272 dated Feb. 12, 2019.
Canadian Office Action corresponding to Canadian Patent Application No. 2973060, dated Dec. 18, 2018.
International Search Report and Written Opinion for PCT/US2019/030036 dated Jul. 19, 2019.
European Office Action for Application 09 752 537.2-1221 dated Oct. 24, 2019.
Berns et al., "Coherent Quasiclassical Dynamics of a Persistent Current Qubit", Physical Review Letters APS USA, vol. 97, No. 15, pp. 150502, Oct. 13, 2006.
Garanin et al., Effects of nonlinear sweep in the Landau-Zener-Stueckelberg effect, Physical Review B, vol. 66, No. 17, pp. 174438-1-174438-11, Nov. 1, 2002.

(56) References Cited

OTHER PUBLICATIONS

Koch, et al.:"A NRZ—Output Amplifier for RSFQ Circuits", IEEE Transaction on Applied Superconductivity, vol. 9, No. 2, pp. 3549-3552, Jun. 1999.

Wulf et al., Dressed States of Josephson Phase Qubit Coupled to an LC Circuit, IEEE Transaction on Applied Superconductivity IEEE USA, vol. 15, No. 2, pp. 856-859, Jun. 2, 2005.

Schuenemann C. et al. "Interleaved Josephson junction tree decoder," IBM Technical Disclosure Bulletin, International Business Machines Corp. (Thorwood), US, vol. 18, No. 12, Apr. 30, 1976, pp. 4168, line 1-p. 4170, line 29; figures I, II.

International Search Report & Written Opinion corresponding to International Application No. PCT/US2018/051076 dated Jan. 2, 2019.

International Search Report & Written Opinion corresponding to International Application No. PCT/US2018/0042466 dated Dec. 12, 2018.

International Search Report & Written Opinion corresponding to International Application No. PCT/US2008/050864 dated Sep. 6, 2008.

Ortlepp et al.; "Experimental Analysis of a new Generation of compact Josephson-inductance-based RSFQ Circuits" Authors are with the Institute of Information Technology, University of Technology Germany.

Internation Search Report & Written Opinion corresponding to International Application No. PCT/US2008/072017 dated Feb. 23, 2009.

Gopalakrishnan, R. et al.: "Novel Very High IE Structures Based on the Directed BBHE Mechanism for Ultralow-Power Flash Memories", IEEE Electron Device Letters, vol. 26, No. 3, Mar. 2005.

Choi, W. Y. et al.: "80nm Self-Aligned Complementary I-MOS Using Double Sidewall Spacer and Elevated Drain Structure and Its Applicability to Amplifiers with High Linearity", IEEE Electron Device Letters, vol. 8, No. 5, dated 2004.

Choi, W. Y et al.: "Novel Tunneling Devices with Multi-Functionality", Japanese Journal of Applied Physics, vol. 16, No. 1B, dated 2007; pp. 2622-2625.

International Search Report corresponding to International Application No. PCT/US2009/045167, dated Feb. 5, 2010.

Semenov, et al., "SFQ Control Circuits for Josephson Junction Qubits", IEEE Trans. on Applied Superconductivity, vol. 13, No. 2, Jun. 2003, pp. 960-965.

Canadian Office Action corresponding to Canadian Patent Application No. 2882109 dated Mar. 11, 2016.

Polonsky, et al., Transmission of Single-Flux-Quantum Pulses along Superconducting Microstrip Lines, IEEE Trans. on Applied Superconductivity, vol. 3, No. 1, Mar. 1993, pp. 2598-2600.

Ohki et al., "Low-Jc Rapid Single Flux Quantum (RSFQ) Qubit Control Circuit", IEEE Transactions on Applied Superconductivity, vol. 17, No. 2, Jun. 2007.

Allman, et al.:"rt-SQUID-Mediated Coherent Tunable Coupling Between a Superconducting Phase Qubit and a Lumped-Element Resonator"; Physical Review Letters, 2010 The American Physical Society, PRL 104, week endinq Apr. 30, 201 O, paqes 177004-1 thru 177004-4.

Johnson, et al.: "A Scalable Control System for a Superconducting Adiabatic Quantum Optimization Processor" arXiv:0907.3757v2 fquant-phl Mar. 24, 2010, paqes 1-14.

Saira, et al.:"Entanglement genesis by anciila-based parity measurement in 20 circuit QED" Physical review letters 1 i 2.7 ( 201 4): 070502.

Galiautdinov, et al.: "Resonator-zero-qubit architecture for superconducting qubits" Physical Review A 85.4 (201 2) 042321, Department of Electrical Engineering and Physics, University of California. pp. 1-11.

Bourassa, et al.: " Ultra.strong coupling regime of cavity QED with phase-biased flux qubits" Physical Review A 80.3 (2009): 032109.

International Search Report corresponding to International Application No. PCT/US2015/052666 dated Jan. 3, 2016.

RSFQubit, RSFQ Control of Josephson Junctions Qubits, D7: Report on the Evaluation of the RSFQ Circuitry for Qubit Control, Sep. 1, 2005, paqes 1-16.

Herr, et al.: "Ultra-Low-Power Superconductor Logic", Journal of Applied Physics, American Institute of Physics, US, vol. 109, No. 10, May 17, 2011, pp. 103903-103903, XP012146891, ISSN: 0021-8979, 001: 10.1063/1.3585849, p. 2, left-hand column, paragraph 4-right-hand column paragraph 1; Fig. 1.

Gui-Long, et al., "A Simple Scheme to Generate X-type Four-charge Entangled States in Circuit QED", Chinese Physics B, Chinese Physics B, Bristol GB, vol. 21, No. 4, Apr. 5, 2012 (Apr. 5, 2012), pp. 44209/1-44209/5. XP020221550, ISSN: 1674-1056, DOI: 10.1088/1674-1056/21/4/044209.

International Search Report corresponding to International Application No. PCT/US2016/053412, dated Dec. 21, 2016.

International Search Report corresponding to International Application No. PCT/US2013/054161, dated Feb. 25, 2014.

Australian Examination Report for Application No. 2017360505 dated Dec. 24, 2019.

Takeuchi N et al., "On-chip RSFQ microwave pulse generator using a multi-flux-quantum driver for controlling superconducting qubits", Physica C, vol. 470, No. 20, doi: 10.1016/J.PHYSC.2010.05.159, ISSN 0921-4534, (May 15, 2010), pp. 1550-1554, (May 15, 2010).

Non Final Office Action for U.S. Appl. No. 15/915,976 dated Dec. 6, 2019.

Japanese Office Action for Application No. 2019-521831 dated Jun. 23, 2020.

Japanese Office Action for Application No. 2020-517875 dated Feb. 24, 2021.

Japanese Office Action for Application No. 2020-503925 dated Mar. 2, 2021.

Canadian Office Action for Application No. 3070090 dated Mar. 15, 2021.

Canadian Office Action for Application No. 3076182 dated Apr. 13, 2021.

Japanese Office Action for Application No. 2020-517875 dated May 18, 2021.

\* cited by examiner

US 11,211,722 B2

SUPERCONDUCTOR INTERCONNECT SYSTEM

RELATED APPLICATION

This application claims priority from U.S. Provisional Patent Application Ser. No. 62/469,400, filed 9 Mar. 2017, which is incorporated herein in its entirety.

TECHNICAL FIELD

The present disclosure relates generally to quantum and classical digital superconducting circuits, and specifically to a superconductor interconnect system.

BACKGROUND

Interconnect systems can, for example, be implemented to provide communication between components of a computer system, such as between separate chips, between computer boards, between cables, or between a combination of associated devices. As an example, a typical interconnect system can be implemented as one or more coupled conductors that are insulated from each other and which are coupled to input or output ports of a respective computer hardware device. High speed communication in computer technologies, such as including digital superconducting computer technologies, can typically include interconnect systems to facilitate communication at radio frequencies. As an example, RF connectors can typically be used with coaxial cables and are designed to maintain the shielding that the coaxial design offers. Coaxial connectors can be implemented to provide RF/microwave communications. However, superconducting computer systems may introduce significant design constraints for communication, such as in cryogenic conditions.

SUMMARY

One embodiment includes a computer interconnect system. The system includes a first cable comprising a first superconducting signal line formed from a superconductor material to propagate a respective at least one signal and a second cable comprising a second superconducting signal line formed from the superconductor material to propagate the respective at least one signal. The system also includes an interconnect structure configured to contact each of the first and second cable and comprising a third superconducting signal line formed from the superconductor material and configured to propagate the respective at least one signal between the respective first and second superconducting signal line. The system further includes at least one interconnect contact disposed on the first, second, and third at least one superconducting signal line at a contact portion between each of the at least one first and third superconducting signal lines and the at least second and third superconducting signal lines.

Another example includes a method for fabricating a computer interconnect system. The method includes depositing a superconductor material on a first substrate to form a first cable comprising at least one first superconducting signal line configured to propagate a respective at least one signal and depositing the superconductor material on a second substrate to form a second cable comprising at least one second superconducting signal line configured to propagate the respective at least one signal. The method also includes depositing the superconductor material on a third substrate to form an interconnect structure comprising at least one third superconducting signal line and forming at least one interconnect contact on a respective contact portion of at least one of the first, second, and third at least one superconducting signal line. The method further includes coupling the interconnect structure to the first and second cables to provide contact at the respective contact portion between each of the at least one first and third superconducting signal line and the at least second and third superconducting signal line to facilitate propagation of at least one signal between the at least one first superconducting signal line and the at least one second superconducting signal line via the at least one third superconducting signal line.

Another example includes a computer interconnect system. The system includes a first cable comprising at least one first superconducting signal line formed from a superconductor material and configured to propagate a respective at least one signal and a second cable comprising at least one second superconducting signal line formed from the superconductor material and configured to propagate the respective at least one signal. The system also includes an interconnect structure comprising at least one keying structural element. The interconnect structure can be configured to contact each of the first and second cable in a keyed arrangement based on the at least one keying structural element. The interconnect structure includes at least one third superconducting signal line formed from the superconductor material and configured to propagate the respective at least one signal between the respective at least one first superconducting signal line and the at least one second superconducting signal line. The system further includes at least one interconnect contact disposed on at least one of the first, second, and third at least one superconducting signal line at a contact portion between each of the at least one first and third superconducting signal lines and the at least second and third superconducting signal lines.

DETAILED DESCRIPTION

Figure 1:
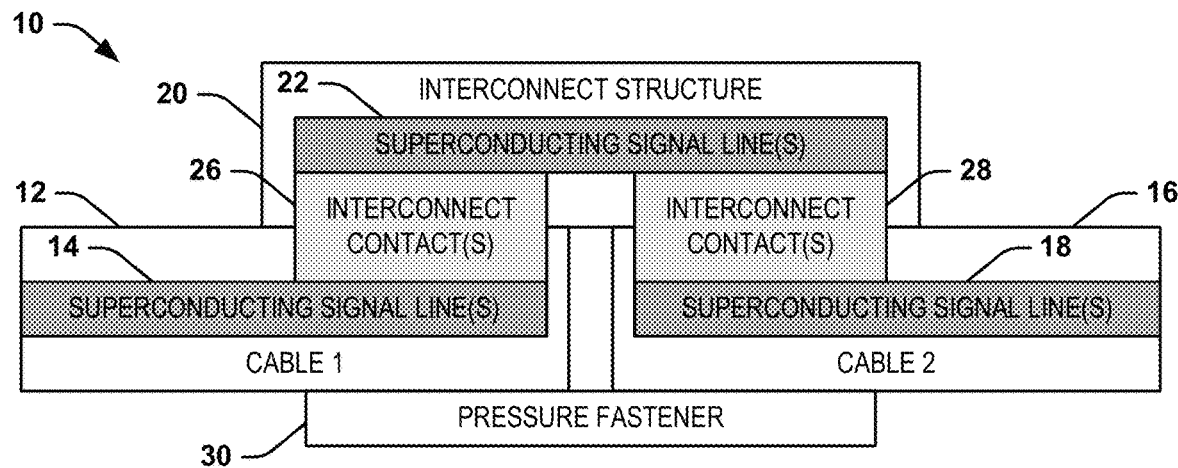
FIG. 1 illustrates an example of a superconductor interconnect system.

The present disclosure relates generally to quantum and classical digital superconducting circuits, and specifically to a superconductor interconnect system. As an example, the superconducting interconnect system can be implemented in a classical and/or quantum computer environment, such as at temperatures of approximate 4° Kelvin or less. The superconductor interconnect system can be implemented in any of a variety of applications that requires a superconducting signal (e.g., a single flux quantum (SFQ) pulse or a reciprocal quantum logic (RQL) signal) to propagate from one superconducting medium to another. As an example, the superconducting medium can be fabricated as one or more superconducting signal lines formed from a superconducting material (e.g., niobium) and which are patterned on a substrate to form respective first and second cables and an interconnect structure that can join the cables. As an example, the superconducting signal lines can be arranged on the substrate with or without a ground plane. The interconnect structure can thus be coupled to the first and second cables in a manner that couples the superconducting signal line(s) to facilitate propagation of the signal(s) from one cable to the other cable. For example, the interconnect structure can allow coupling of computing devices to cables to allow separate respective computing devices to communicate via the superconducting signals, or can allow coupling of cables to facilitate propagation of the superconducting signals across long distances.

The superconductor interconnect system can include one or more interconnect contacts that are arranged on a contact portion of the one or more of the superconducting signal lines associated with the cables and/or the interconnect structure. As a first example, the interconnect contact(s) can be configured as a metallic material layer that is formed on the superconducting material of the superconducting signal line(s). For example, the metallic material layer can be provided as a thin layer (e.g., between approximately 10 nm and 30 nm) of gold (e.g., approximately 20 nm). While the discussion herein describes that the metallic material layer can be gold, it is to be understood that gold alloys (e.g., gold-palladium (Au—Pd), gold-platinum (Au—Pt), gold-rhenium (Au—Re), or gold-iridium (Au—Ir)) can instead be implemented. The interconnect structure can also include a pressure fastener that joins the superconducting signal line(s) at the respective contact portions to provide superconducting capability of the thin metallic material layer. As another example, the interconnect contacts can be arranged as metallic springs (e.g., gold) that can provide the pressurized contact between the superconducting signal line(s) of the cables and the interconnect structure. As yet another example, the interconnect contacts can be arranged as nanolattice structures or other types of topographical structures formed from the superconducting material. Thus, in combination with a pressure fastener, the nanolattice or other types of structures can provide a "wiping" action on the superconducting material of the superconducting signal lines to remove oxidation, and to thus preserve superconducting capability across the contact portion between the cable and the interconnect structure.

FIG. 1 illustrates an example of a superconductor interconnect system 10. The superconductor interconnect system 10 can be implemented in any of a variety of applications that require a superconducting signal, demonstrated in the example of FIG. 1 as a signal SC to propagate from one superconducting medium to another. As an example, the signal SC can be provided as a single flux quantum (SFQ) pulse (e.g., a fluxon) or as a reciprocal quantum logic (RQL) pulse pair that includes both a fluxon and an anti-fluxon. The superconductor interconnect system 10 includes a first cable 12 that includes one or more superconducting signal lines 14 and a second cable 16 that includes one or more superconducting signal lines 18. The superconducting signal line(s) 14 and 18 can be formed from a superconducting material (e.g., niobium) that propagate the signal SC. As an example, the superconducting signal line(s) 14 and 18 can be patterned on a substrate, such as on one surface or two opposing surfaces, to propagate multiple signals SC along the respective cables 12 and 16.

The superconductor interconnect system 10 also includes an interconnect structure 20. The interconnect structure 20 is demonstrated as being coupled to the first and second cables 12 and 16, and includes superconducting signal line(s) 22 that are in contact with the respective superconducting signal line(s) 14 and 18 to facilitate propagation of the signal(s) SC between the first and second cables 12 and 16. In the example of FIG. 1, the superconducting signal line(s) 22 are coupled to the superconducting signal line(s) 14 via a first set of one or more interconnect contacts 26 and to the superconducting signal line(s) 18 via a second set of one or more interconnect contacts 28. As an example, the interconect contact(s) 26 and 28 can be formed on the superconducting signal line(s) 22, on the superconducting signal line(s) 14 and 18, or on both, at respective contact portions. As a result, the superconducting signal line(s) 22 is coupled to the superconducting signal line(s) 14 at a contact portion via the interconnect contact(s) 26 and to the superconducting signal line(s) 18 at a contact portion via the interconnect contact(s) 28. In addition, in the example of FIG. 1, the interconnect structure 20 can facilitate coupling to the first and second cables 12 and 16 via a pressure fastener 30 that is configured to provide pressure at the contact portions, as described in greater detail herein.

Figure 2:
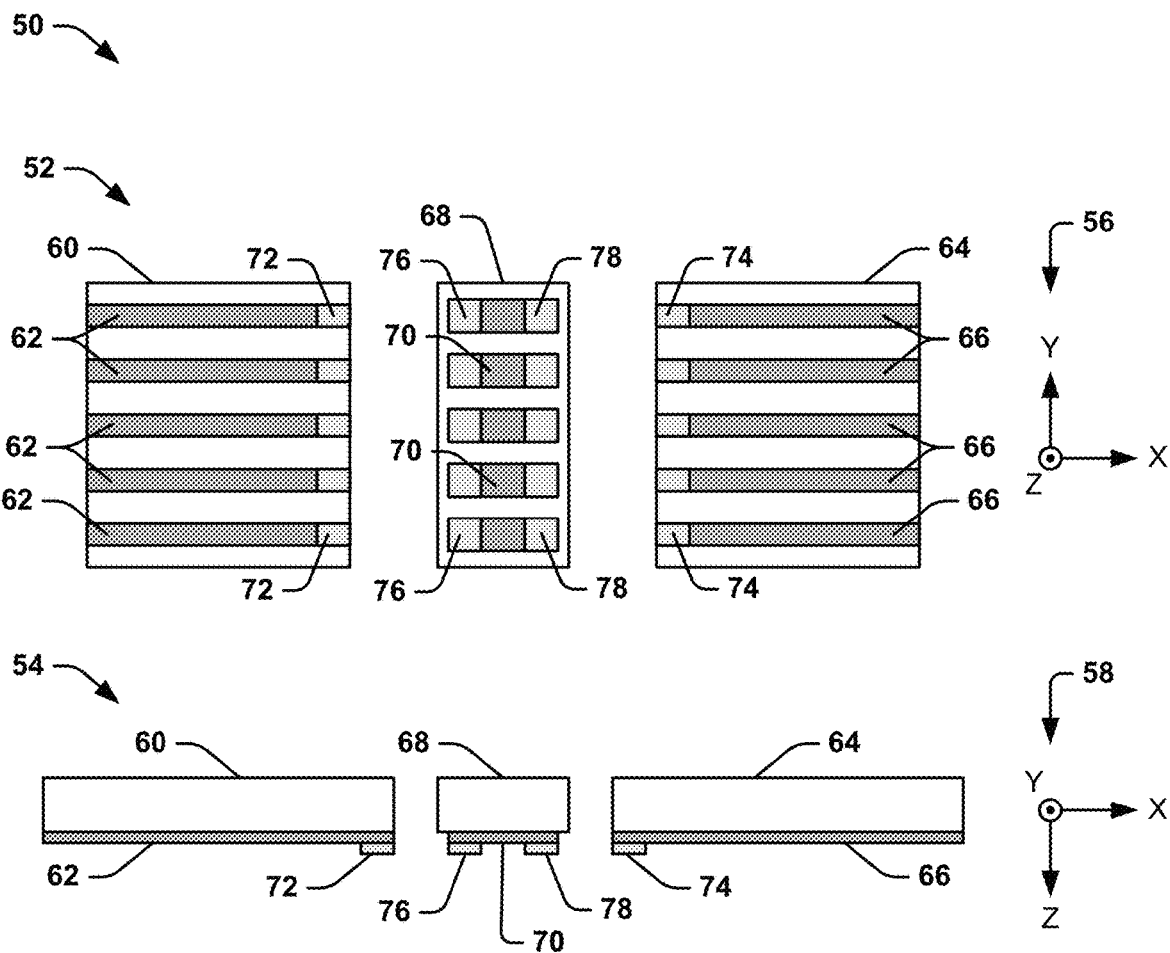
FIG. 2 illustrates an example diagram of a superconductor interconnect system.

FIG. 2 illustrates an example diagram 50 of a superconductor interconnect system. The superconductor interconnect system is demonstrated in the example, of FIG. 2 in a deconstructed manner in a first view 52 and in a second view 54, demonstrated by the Cartesian coordinate systems 56 and 58, respectively. As an example, the superconductor interconnect system demonstrated in the diagram 50 can correspond to the superconductor interconnect system 10 in the example of FIG. 1. Therefore, reference is to be made to the example of FIG. 1 in the following description of the example of FIG. 2.

The superconductor interconnect system includes a first cable 60 that includes a plurality of superconducting signal lines 62 and a second cable 64 that includes a respective plurality of superconducting signal lines 66. The superconducting signal lines 62 and 66 can be formed from a superconducting material (e.g., niobium) that can propagate respective superconducting signals. The superconductor interconnect system also includes an interconnect structure 68. The interconnect structure 68 is demonstrated as being coupled to the first and second cables 60 and 64, and includes superconducting signal lines 70 that are configured to contact the respective superconducting signal lines 62 and 66 to facilitate propagation of the superconducting signals between the first and second cables 60 and 64.

In the example of FIG. 2, each of the superconducting signal lines 62 includes respective interconnect contacts 72, each of the superconducting signal lines 66 includes respective interconnect contacts 74, and each of the superconducting signal lines 70 includes respective interconnect contacts 76 on a first end and interconnect contacts 78 on a second end opposite the first end. The location of the interconnect contacts 72, 74, 76, and 78 on the respective superconducting signal lines 62, 66, and 70 can correspond to contact portions of the respective superconducting signal lines 62, 66, and 70. Therefore, the interconnect contacts 72 and 76 can be arranged in physical contact and the interconnect contacts 74 and 78 can be arranged in physical contact at the respective contact portions. In the example of FIG. 2, it is to be understood that the interconnect contacts 72, 74, 76, and 78 and the superconducting signal lines 62, 66, and 70 are not necessarily illustrated to scale, but are instead demonstrated simplistically for demonstrative purposes.

As an example, the interconnect contacts 72, 74, 76, and 78 can be arranged as very thin layers of a metallic material, such as gold. For example, the very thin layers of the metallic material can be between approximately 10 nm and approximately 30 nm (e.g., approximately 20 nm). Particularly, the layers of the metallic material can be sufficiently thick to provide reliable signal contact and can be sufficiently thin to operate as superconducting when in pressurized contact with a superconducting material or another very thin layer of metallic material via the proximity effect. As another example, at very cold temperatures (e.g., less than 4° Kelvin), the very thin layers of the metallic material can have a thickness of up to approximately 100 nm and still provide sufficient reliable signal contact via the proximity effect. As yet another example, the interconnect contacts 72, 74, 76, and 78 can be arranged as nanolattice structures formed from the superconducting material of the respective superconducting signal lines 62, 66, and 70 (e.g., niobium). Therefore, the nanolattice interconnect contacts 72, 74, 76, and 78 can provide a wiping action on the respective superconducting signal lines 62, 66, and 70 (e.g., under pressurized contact) to substantially remove oxidation from the superconducting signal lines 62, 66, and 70 to maintain a superconducting contact between the respective superconducting signal lines 62, 66, and 70.

As yet another example, other types of topographical structures can be formed as the interconnect contacts 72, 74, 76, and 78, such as hemispherical bumps. For example, the hemispherical bumps can be formed on the superconducting material (e.g., the superconducting signal lines) or can be formed underneath the superconducting material (e.g., on the substrate) and covered by the superconducting material, and can be coated to include the very thin layers of a metallic material, such as gold, similar to as described previously. The topographical structures can be formed, for example, on one of the respective pairs of the interconnect contacts 72, 74, 76, and 78. While the topographical features (e.g., hemispherical bumps) may have less contact area, the respective interconnect contact(s) 72, 74, 76, and 78 can provide a greater pressure at the respective contact portion, which can thus provide for a greater contact reliability.

Figure 3:
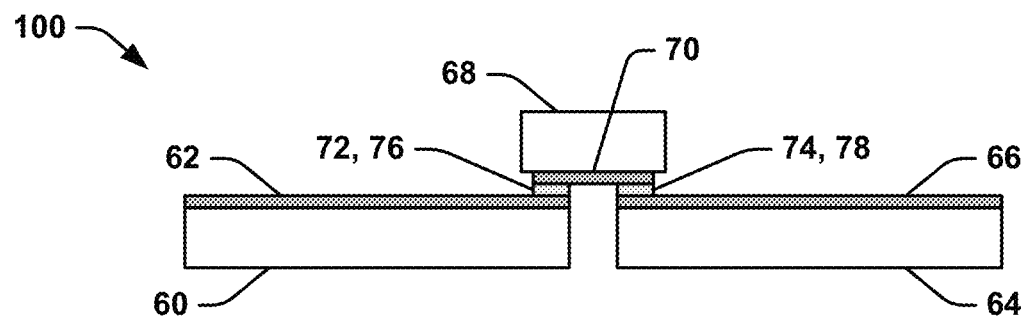
FIG. 3 illustrates another example diagram of a superconductor interconnect system.

The assembled superconductor interconnect system is demonstrated in the example of FIG. 3. Particularly, FIG. 3 illustrates another example of a superconductor interconnect system 100 corresponding to the superconductor interconnect system of FIG. 2 assembled. The coupling of the interconnect structure 68 to the first and second cables 60 and 64 at the contact portions can be provided via a pressure fastener (not shown) to provide pressurized contact at the contact portions. Therefore, the pressurized contact can allow superconducting of the interconnect contacts 72, 74, 76, and 78 between the respective superconducting signal lines 62, 66, and 70 via the proximity effect or via a wiping action to substantially remove oxidation. As a result, a superconducting signal can propagate from one of the superconducting signal lines 62 to a respective one of the superconducting signal lines 70 via the interconnect contacts 72 and 76, and can propagate from the given one of the superconducting signal lines 70 to a respective one of the superconducting signal lines 66 via the interconnect contacts 78 and 74.

Figure 4:
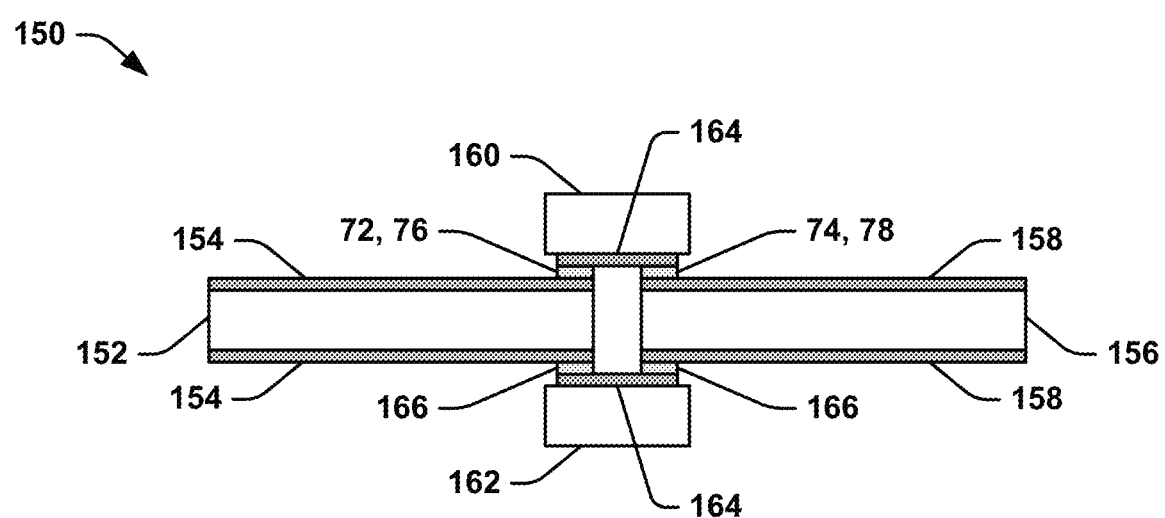
FIG. 4 illustrates another example diagram of a superconductor interconnect system.

In the examples of FIGS. 1-3, the cables are demonstrated as including the superconducting signal lines on only one surface. However, it is to be understood that the cables could instead include superconducting signal lines formed on each of at least two surfaces, such as on opposing surfaces of a substrate. FIG. 4 illustrates another example of a superconductor interconnect system 150. Similar to as described previously in the examples of FIGS. 1-3, the superconductor interconnect system 150 includes a first cable 152 that includes at least one superconducting signal line 154 patterned on each of opposing surfaces of the first cable 152, and includes a second cable 156 that includes a respective at least one superconducting signal line 158 patterned on each of opposing surfaces of the second cable 156. The superconducting signal line(s) 154 and 158 can be formed from a superconducting material (e.g., niobium) that can propagate respective superconducting signals. The superconductor interconnect system 150 also includes a first interconnect structure 160 and a second interconnect structure 162. The interconnect structures 160 and 162 are each demonstrated as being coupled to the first and second cables 152 and 156, and each includes at least one superconducting signal line 164 that is configured to contact the respective superconducting signal line(s) 154 and 158 on each surface of the first and second cables 152 and 156 to facilitate propagation of the superconducting signals between the first and second cables 152 and 156.

Each of the interconnect structures 160 and 162 can be fabricated substantially the same as the interconnect structure 68 in the example of FIGS. 2 and 3. For example, in the example of FIG. 4, the superconductor interconnect system 150 can include interconnect contact(s) 166 between contact points of the superconducting signal line(s) 164 of each of the interconnect structures 160 and 162. For example, the interconnect contact(s) 166 can include interconnect contacts that are patterned on at least one of the superconducting signal line(s) 154 and 158 and the superconducting signal line(s) 164. For example, the interconnect contact(s) 166 can be arranged as very thin layers of a metallic material, such as gold, having a thickness between approximately 10 nm and approximately 30 nm (e.g., approximately 20 nm). As another example, the interconnect contact(s) 166 can be arranged as nanolattice structures formed from the superconducting material of the respective superconducting signal line(s) 154 and 158 and the superconducting signal line(s) 164. Therefore, the nanolattice interconnect contact(s) 166 can provide a wiping action on the respective superconducting signal line(s) 154 and 158 and the superconducting signal line(s) 164 (e.g., under pressurized contact) to substantially remove oxidation from the superconducting signal line(s) 154 and 158 and the superconducting signal line(s) 164 to maintain a superconducting contact between the respective superconducting signal line(s) superconducting signal line(s) 154 and 158 and the superconducting signal line(s) 164. As yet another example, the interconnect contact(s) 166 can be formed to include topographical features (e.g., hemispherical bumps) that are coated with the very thin metallic layer (e.g., gold), similar to as described previously.

Figure 5:
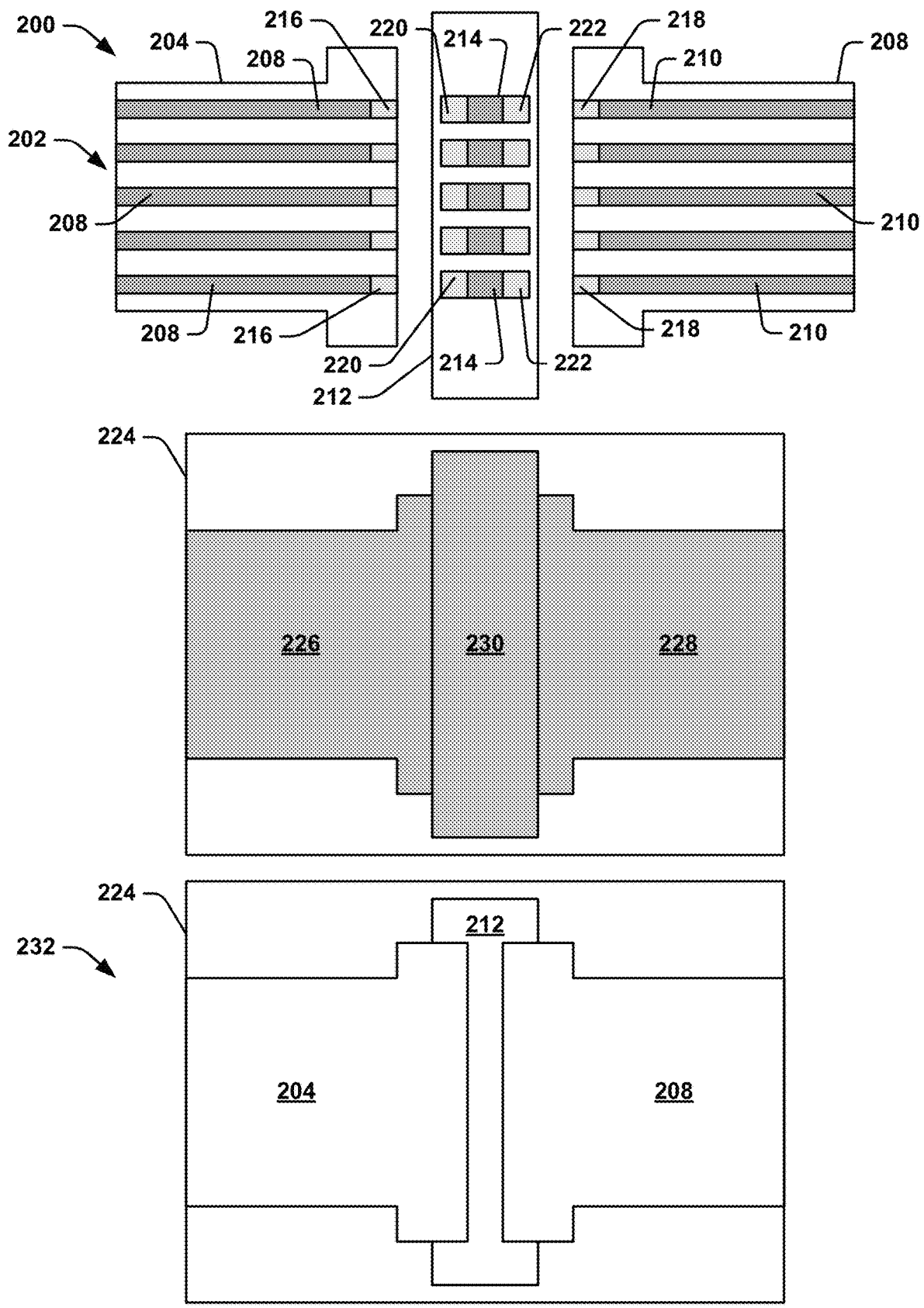
FIG. 5 illustrates another example diagram of a superconductor interconnect system.

FIG. 5 illustrates another example diagram 200 of a superconductor interconnect system. The superconductor interconnect system is demonstrated in the example, of FIG. 5 in a deconstructed manner in a first view 202. As an example, the superconductor interconnect system demonstrated in the diagram 200 can correspond to the superconductor interconnect system 10 in the example of FIG. 1.

Therefore, reference is to be made to the example of FIG. 1 in the following description of the example of FIG. 5.

The superconductor interconnect system includes a first cable 204 that includes a plurality of superconducting signal lines 206 and a second cable 208 that includes a respective plurality of superconducting signal lines 210. The superconducting signal lines 206 and 210 can be formed from a superconducting material (e.g., niobium) that can propagate respective superconducting signals. The superconductor interconnect system also includes an interconnect structure 212. The interconnect structure 212 can be coupled to the first and second cables 204 and 208, and includes superconducting signal lines 214 that are configured to contact the respective superconducting signal lines 206 and 210 to facilitate propagation of the superconducting signals between the first and second cables 204 and 208.

In the example of FIG. 5, each of the superconducting signal lines 206 includes respective interconnect contacts 216, each of the superconducting signal lines 210 includes respective interconnect contacts 218, and each of the superconducting signal lines 214 includes respective interconnect contacts 220 on a first end and interconnect contacts 222 on a second end opposite the first end. The location of the interconnect contacts 216, 218, 220, and 222 on the respective superconducting signal lines 206, 210, and 214 can correspond to contact portions of the respective superconducting signal lines 206, 210, and 214. Therefore, the interconnect contacts 216 and 220 can be arranged in physical contact and the interconnect contacts 218 and 222 can be arranged in physical contact at the respective contact portions. In the example of FIG. 5, it is to be understood that the interconnect contacts 216, 218, 220, and 222 and the superconducting signal lines 206, 210, and 214 are not necessarily illustrated to scale, but are instead demonstrated simplistically for demonstrative purposes.

In the example of FIG. 5, the superconductor interconnect system also includes a connection base 224 that can be coupled to each of the interconnect structure 212, the first cable 204, and the second cable 208. The connection base 224 can be configured to provide keyed coupling between each of the interconnect contacts 216 and 220 and the interconnect contacts 218 and 222. In the example of FIG. 5, the connection base 224 is demonstrated as including a first recess 226 that is configured to receive the interconnect structure 212, a second recess 228 that is configured to receive the first cable 204, such as in a manner that overlays the interconnect structure 212, and a third recess 230 that is configured to receive the second cable 208, such as opposite the first cable 204 in a manner that overlays the interconnect structure 212. As an example, the receisses 226, 228, and 230 can be dimensioned to specifically fit the first cable 204, the second cable 208, and the interconnect structure 212, respectively.

The diagram 200 also includes the assembled superconductor interconnect system 232 that includes the interconnect structure 212 that is provided in the first recess 226, such that the interconnect structure 212 is provided in the same orientation as demonstrated in the first view 202. The assembled superconductor interconnect system 232 also includes the first cable 204 and the second cable 208 provided in the second and third recesses 228 and 230, respectively. Each of the first and second cables 204 and 208 are demonstrated in the assembled superconductor interconnect system 232 as inverted relative to the first view 202, such that the interconnect contacts 216 and 220 are arranged in physical contact and the interconnect contacts 218 and 222 are arranged in physical contact at the respective contact portions. As a result, the connection base 224 facilitates keyed coupling of the interconnect structure 212 and the first and second cables 204 and 208 to ensure that the interconnect contacts 216 and 220 and the interconnect contacts 218 and 222 are coupled at the respective contact portions.

Figure 6:
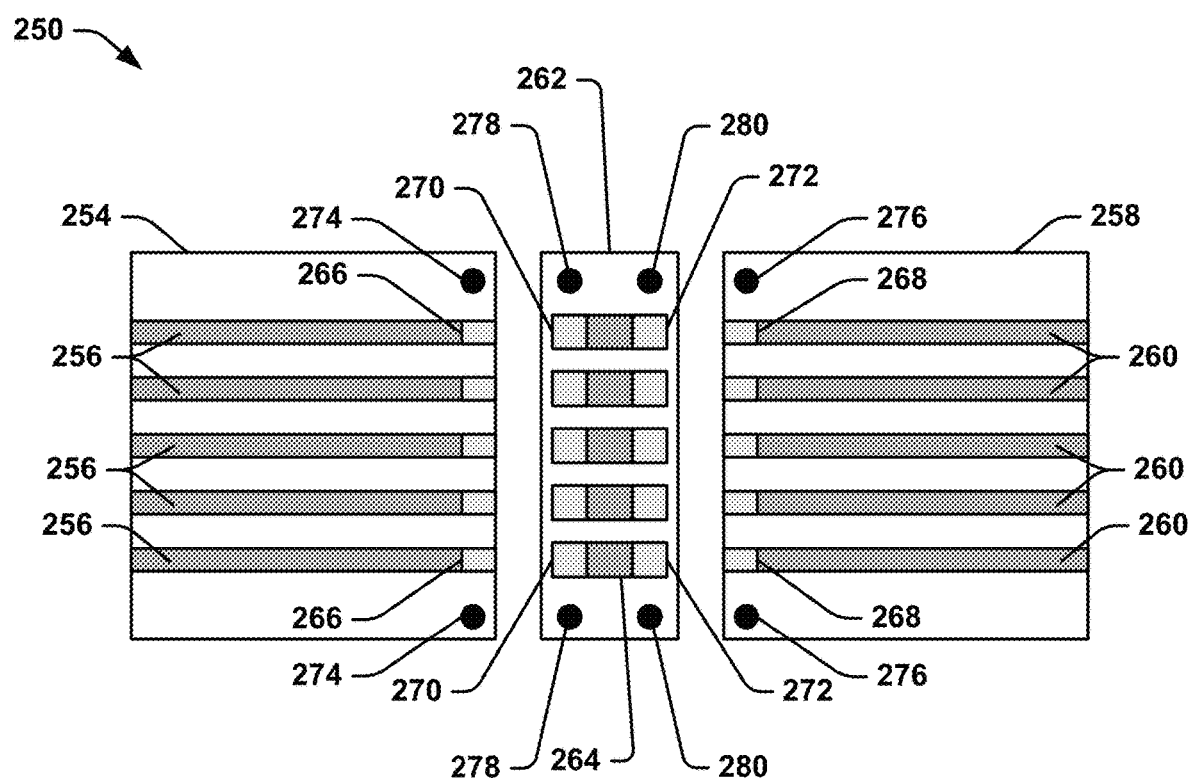
FIG. 6 illustrates another example diagram of a superconductor interconnect system.

FIG. 6 illustrates another example diagram 250 of a superconductor interconnect system. The superconductor interconnect system is demonstrated in the example, of FIG. 6 in a deconstructed manner. As an example, the superconductor interconnect system demonstrated in the diagram 250 can correspond to the superconductor interconnect system 10 in the example of FIG. 1. Therefore, reference is to be made to the example of FIG. 1 in the following description of the example of FIG. 6.

The superconductor interconnect system includes a first cable 254 that includes a plurality of superconducting signal lines 256 and a second cable 258 that includes a respective plurality of superconducting signal lines 260. The superconducting signal lines 256 and 260 can be formed from a superconducting material (e.g., niobium) that can propagate respective superconducting signals. The superconductor interconnect system also includes an interconnect structure 262. The interconnect structure 262 can be coupled to the first and second cables 254 and 258, and includes superconducting signal lines 264 that are configured to contact the respective superconducting signal lines 256 and 260 to facilitate propagation of the superconducting signals between the first and second cables 254 and 258.

In the example of FIG. 6, each of the superconducting signal lines 256 includes respective interconnect contacts 266, each of the superconducting signal lines 260 includes respective interconnect contacts 268, and each of the superconducting signal lines 264 includes respective interconnect contacts 270 on a first end and interconnect contacts 272 on a second end opposite the first end. The location of the interconnect contacts 266, 268, 270, and 272 on the respective superconducting signal lines 256, 260, and 264 can correspond to contact portions of the respective superconducting signal lines 256, 260, and 264. Therefore, the interconnect contacts 266 and 270 can be arranged in physical contact and the interconnect contacts 268 and 272 can be arranged in physical contact at the respective contact portions. In the example of FIG. 6, it is to be understood that the interconnect contacts 266, 268, 270, and 272 and the superconducting signal lines 256, 260, and 264 are not necessarily illustrated to scale, but are instead demonstrated simplistically for demonstrative purposes.

In the example of FIG. 6, the interconnect structure 262 includes pin-holes 274 and 276, the first cable 254 includes pin-holes 278, and the second cable 258 includes pin-holes 280. As an example, the pin-holes 274, 276, 278, and 280 can receive a pin, screw, or other fastening device (hereinafter "pin") to provide keyed coupling between each of the interconnect contacts 266 and 270 and the interconnect contacts 268 and 272. For example, the superconductor interconnect system can be coupled as an assembly, such as demonstrated in the example of FIG. 3 (or in the example of FIG. 4, in the example of the first and second cables 254 and 258 having double-sided superconducting signal lines). Thus, pins can extend through each of the pin-holes 274 and the corresponding respective pin-holes 278 to secure the first cable 254 to the interconnect structure 262, and pins can extend through each of the pin-holes 276 and the corresponding respective pin-holes 280 to secure the second cable 258 to the interconnect structure 262. As a result, the pin-holes 274, 276, 278, and 280 facilitate keyed coupling of the interconnect structure 262 and the first and second cables 254 and 258 to ensure that the interconnect contacts 266 and 270 and the interconnect contacts 268 and 272 are coupled at the respective contact portions.

Figure 7:
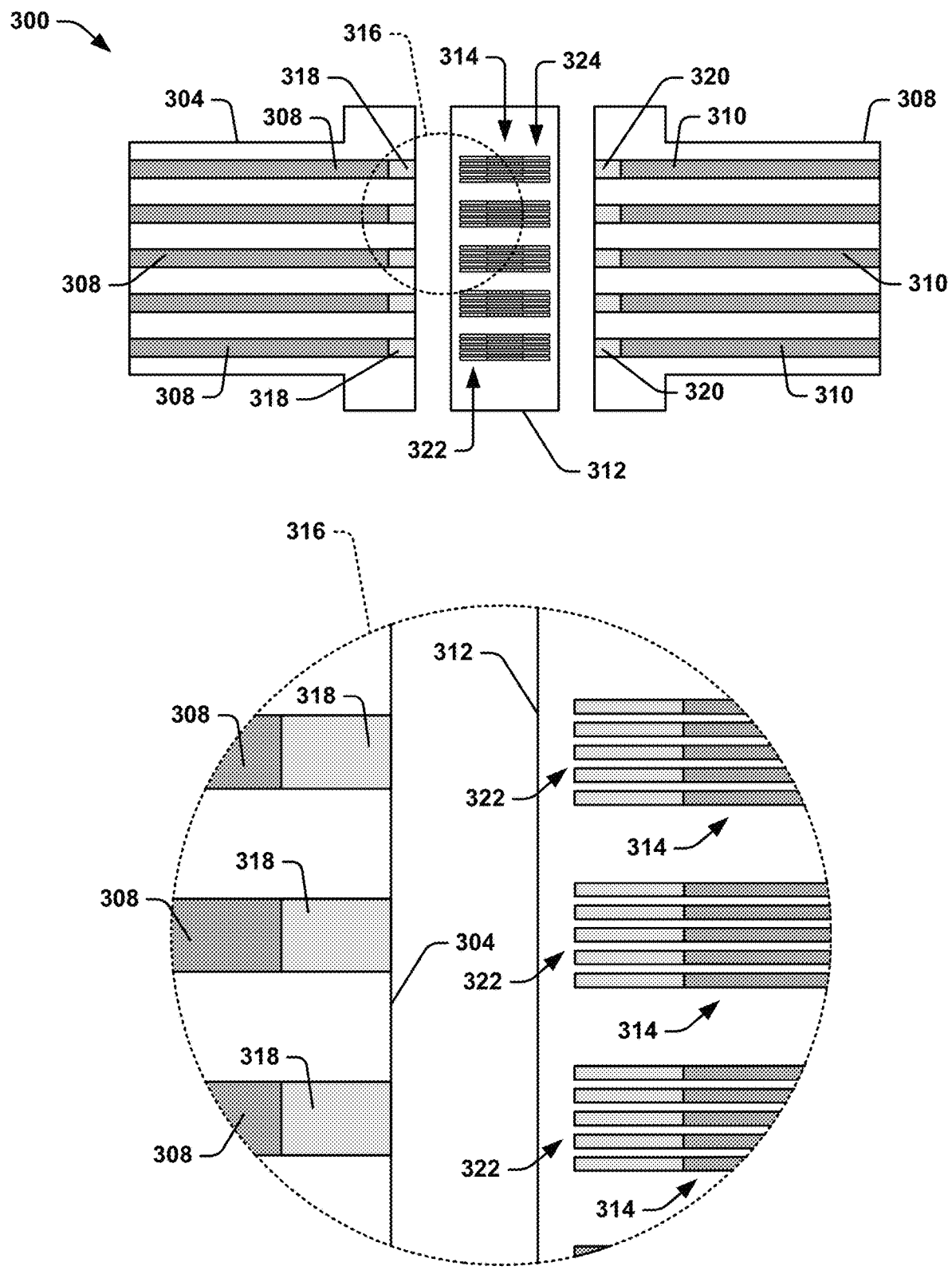
FIG. 7 illustrates another example diagram of a superconductor interconnect system.

FIG. 7 illustrates another example diagram 300 of a superconductor interconnect system. The superconductor interconnect system is demonstrated in the example, of FIG. 7 in a deconstructed manner in a first view 302. As an example, the superconductor interconnect system demonstrated in the diagram 300 can correspond to the superconductor interconnect system 10 in the example of FIG. 1. Therefore, reference is to be made to the example of FIG. 1 in the following description of the example of FIG. 7.

The superconductor interconnect system includes a first cable 304 that includes a plurality of superconducting signal lines 306 and a second cable 308 that includes a respective plurality of superconducting signal lines 310. The superconducting signal lines 306 and 310 can be formed from a superconducting material (e.g., niobium) that can propagate respective superconducting signals. The superconductor interconnect system also includes an interconnect structure 312. The interconnect structure 312 can be coupled to the first and second cables 304 and 308, and includes superconducting signal lines 314 that are configured to contact the respective superconducting signal lines 306 and 310 to facilitate propagation of the superconducting signals between the first and second cables 304 and 308. In the example of FIG. 7, and as demonstrated in greater detail in the exploded view 316, the superconducting signal lines 314 are demonstrated as having a quantity of superconducting signal lines that is significantly greater than a quantity of superconducting signal lines 306 and 310 of the respective first and second cables 304 and 308. For example, the superconducting signal lines 314 can each have at least one of a cross-sectional width and a spacing between the superconducting signal lines 314 that is less than a width of each of the superconducting signal lines 306 and 310. While the superconducting signal lines 314 are demonstrated as being grouped in portions of five superconducting signal lines 314 per group, it is to be understood that other groups, or a single group, can be implemented instead.

In the example of FIG. 7, each of the superconducting signal lines 306 includes respective interconnect contacts 318 and each of the superconducting signal lines 310 includes respective interconnect contacts 320. In addition, each of the superconducting signal lines 314 includes respective interconnect contacts 322 on a first end and interconnect contacts 324 on a second end opposite the first end. The location of the interconnect contacts 318, 320, 322, and 324 on the respective superconducting signal lines 306, 310, and 314 can correspond to contact portions of the respective superconducting signal lines 306, 310, and 314. Therefore, the interconnect contacts 318 and 322 can be arranged in physical contact and the interconnect contacts 320 and 324 can be arranged in physical contact at the respective contact portions. Additionally, because the the superconducting signal lines 314 are much smaller and much more tightly grouped than the superconducting signal lines 306 and 310, the interconnect structure 312 and the first and second cables 304 and 308 can be coupled in a non-keyed manner and still provide connectivity between the superconducting signal lines 306 and 310 via the superconducting signal lines 314. Accordingly, the superconductor interconnect system in the diagram 300 of the example of FIG. 7 provides another manner of assembling the superconductor interconnect system to provide superconducting interconnection of the superconducting signal.

Figure 8:
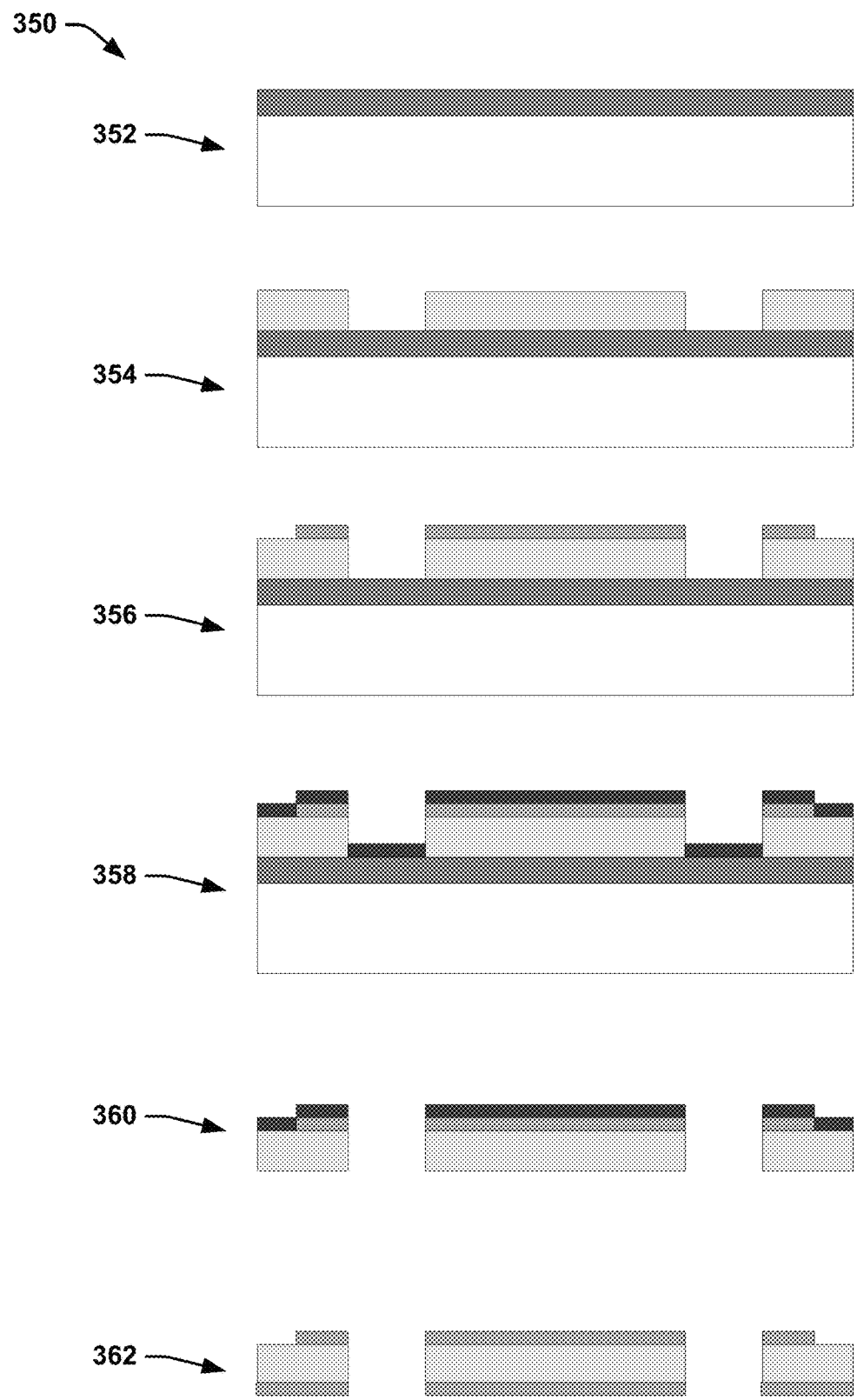
FIG. 8 illustrates an example diagram of fabrication of a cable.

FIG. 8 illustrates an example diagram 350 of fabrication of a cable. As an example, the cable demonstrated as fabricated in the example of FIG. 8 can correspond to one of the first and second cables described herein. As an example, a chromium (Cr, 30 nm)/Aluminum (Al, 200 nm) sacrificial release layer is deposited onto RCA-cleaned and oxidized silicon (Si) handle wafers, as demonstrated at 352. Polyimide HD-4110 is deposited onto wafers using spin-coating, followed by photolithographic definition and curing at approximately 375° C. in an $N_2$ atmosphere, to achieve an approximately 20 μm-thick film as the flexible substrate of the superconducting signal line, as demonstrated at 354. The niobium (Nb, 250 nm) superconducting signal lines and gold (Au, 20 nm) interconnect contacts are formed using photolithography and film lift-off techniques, as demonstrated at 356. Using a CHA Mark 50 deposition system, the niobium film is DC sputter deposited with a power of approximately 8 W/cm$^2$ and argon (Ar) pressure of 4 mTorr. Without breaking vacuum, this can immediately be followed by deposition of the gold layer using electron beam physical vapor deposited at a rate of 2 Å/s after an approximate two minute in-situ ion beam milling surface clean of the niobium surface. Next, as demonstrated at 358, samples are coated with a layer of photoresist for protection of the structures during a film release process. The samples can be soaked in a NaCl salt bath with approximately 0.5 V applied to the release layer, as demonstrated at 360. After releasing of the film and stripping of the photoresist, the samples can be inverted and mounted onto silicon carrier wafers for niobium (250 nm)/gold (20 nm) ground plane deposition, as demonstrated at 362. As such, the resultant cable can, for example, resemble the cables 152 and 156 in the example of FIG. 4. However, the step at 362 can be omitted for cables with superconducting signal lines on only one side, such as the cables 60 and 64 in the example of FIGS. 2 and 3. It is to be understood that the dimensions described in the example of FIG. 8 are examples, and that other dimensions can be implemented for fabrication of a cable instead.

Figure 9:
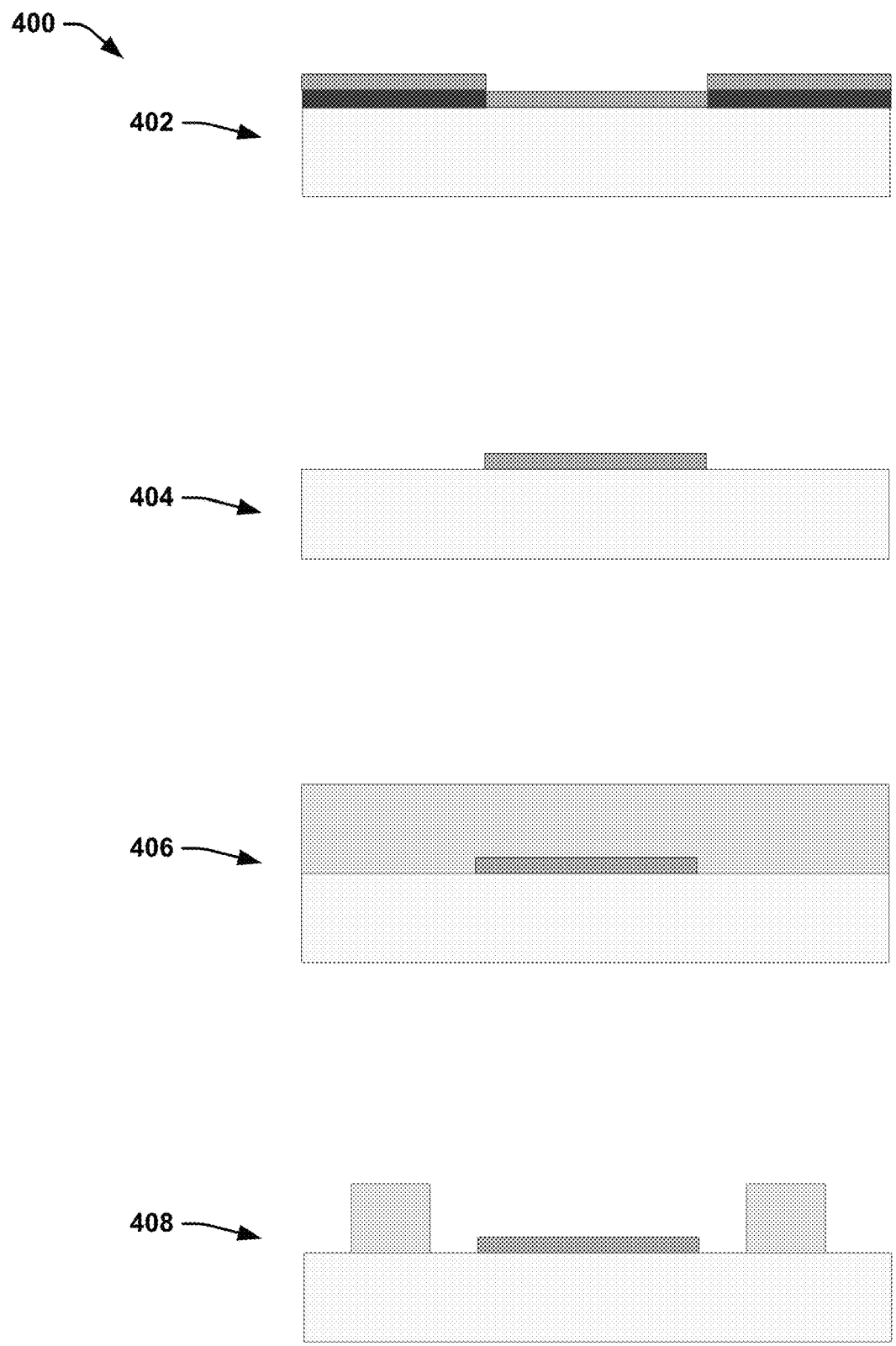
FIG. 9 illustrates an example diagram of fabrication of an interconnect structure.

FIG. 9 illustrates an example diagram 400 of fabrication of an interconnect structure. As an example, the interconnect structure demonstrated as fabricated in the example of FIG. 9 can correspond to one of the interconnect structures described herein. Fabrication of interconnect structure can begin with RCA-cleaned fused-silica wafers. A lift-off process can be used to define the superconducting signal lines, which can be formed with niobium (250 nm)/gold (20 nm) metallization, as demonstrated at 402 and 404. Next, a layer of HD-4110 polyimide can be deposited, as demonstrated at 406, and photolithography can be performed to define pillar alignment structures. The polyimide can then be cured at approximately 225° C. to yield approximately 30 μm-thick pillars, as demonstrated at 408. Finally, the interconnect structures can be diced into individual interconnect structures, with dimension of approximately 8 mm in length and approximately 13 mm in width. Metallized shims, using either silicon or fused silica for the substrate, can be fabricated by deposition of niobium (250 nm)/gold (20 nm) and diced to appropriate sizes. It is to be understood that the dimensions described in the example of FIG. 9 are examples, and that other dimensions can be implemented for fabrication of an interconnect structure instead.

Figure 10:
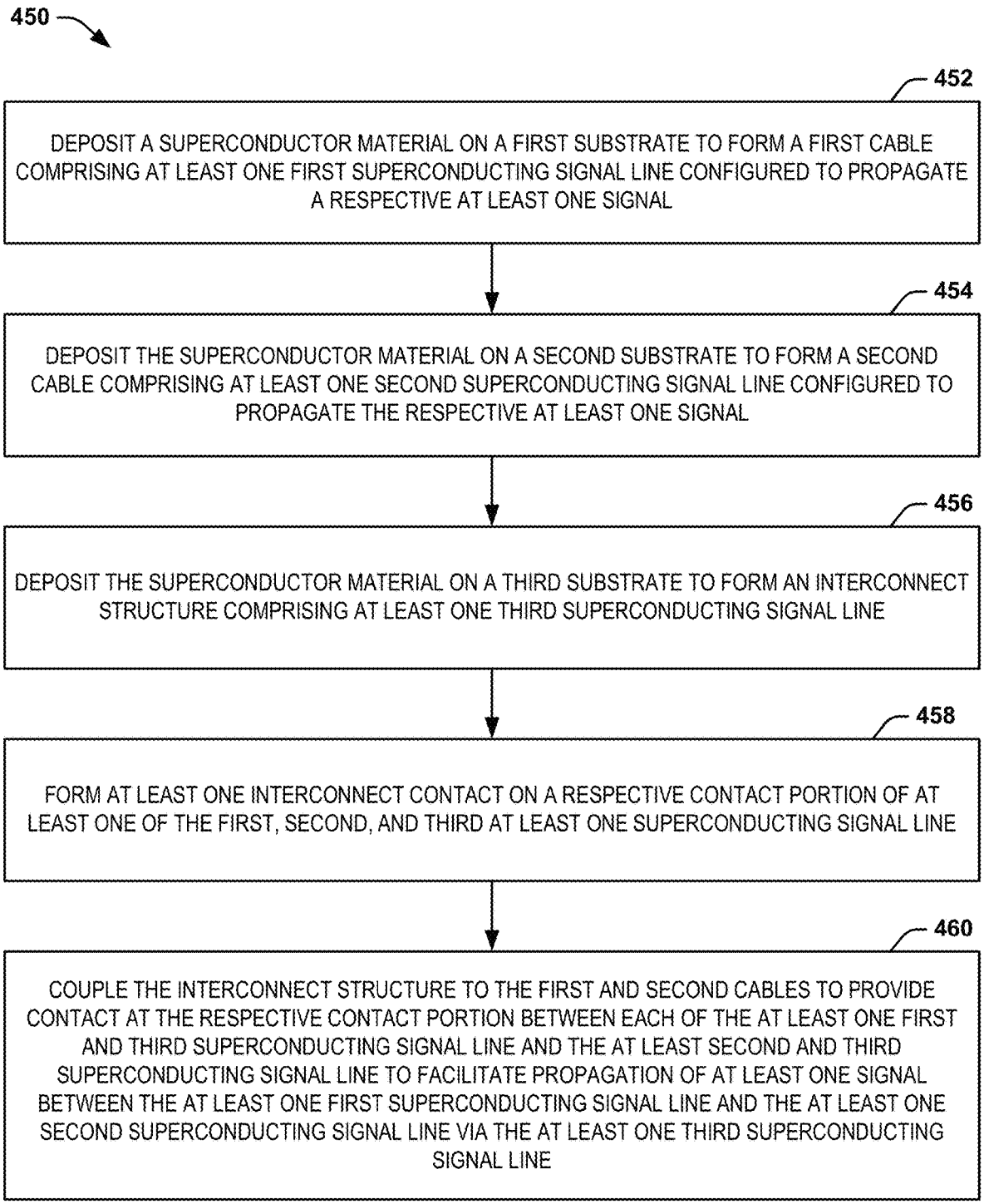
FIG. 10 illustrates an example of a method for fabricating a superconductor interconnect system.

In view of the foregoing structural and functional features described above, a methodology in accordance with various aspects of the present invention will be better appreciated with reference to FIG. 10. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 10 illustrates an example of a method 450 for fabricating a computer interconnect system (e.g., the superconductor interconnect system 10). At 452, a superconductor material is deposited on a first substrate to form a first cable (e.g., the first cable 12) comprising at least one first superconducting signal line (e.g., the superconducting signal line(s) 14) configured to propagate a respective at least one signal (e.g., the superconducting signal SC). At 454, the superconductor material is deposited on a second substrate to form a second cable (e.g., the second cable 16) comprising at least one second superconducting signal line (e.g., the superconducting signal line(s) 18) configured to propagate the respective at least one signal. At 456, the superconductor material is deposited on a third substrate to form an interconnect structure (e.g., the interconnect structure 20) comprising at least one third superconducting signal line (e.g., the superconducting signal line(s) 22). At 458, at least one interconnect contact (e.g., the interconnect contact(s) 26 and 28) is formed on a respective contact portion of at least one of the first, second, and third at least one superconducting signal line. At 460, the interconnect structure is coupled to the first and second cables to provide contact at the respective contact portion between each of the at least one first and third superconducting signal line and the at least second and third superconducting signal line to facilitate propagation of at least one signal between the at least one first superconducting signal line and the at least one second superconducting signal line via the at least one third superconducting signal line.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A computer interconnect system comprising:
 a first cable comprising at least one first superconducting signal line formed from a superconductor material and configured to propagate a respective at least one signal;
 a second cable comprising at least one second superconducting signal line formed from the superconductor material and configured to propagate the respective at least one signal;
 an interconnect structure configured to contact each of the first and second cable and comprising at least one third superconducting signal line formed from the superconductor material and configured to propagate the respective at least one signal between the respective at least one first superconducting signal line and the at least one second superconducting signal line; and
 at least one interconnect contact disposed on at least one of the first and second superconducting signal lines and on the at least one third superconducting signal line at a contact portion between each of the at least one first and third superconducting signal lines and the at least second and third superconducting signal lines.

2. The system of claim 1, wherein the at least one interconnect contact comprises at least one conductive metallic layer.

3. The system of claim 2, wherein the at least one conductive metallic layer is formed as a gold layer disposed on each of the at least one first, second, and third superconducting signal line and having a thickness of between approximately 10 nm and approximately 30 nm.

4. The system of claim 2, wherein the at least one conductive metallic layer has a thickness of between approximately 10 nm and approximately 100 nm at a temperature of less than approximately 4 Kelvin.

5. The system of claim 2, wherein the at least one interconnect contact comprises at least one three-dimensional topographic feature formed from a material associated with at least one of the at least one first, second, and third superconducting signal line, wherein the at least one conductive metallic layer overlays the at least one three-dimensional topographic feature.

6. The system of claim 1, wherein the at least one interconnect contact is arranged as a nanolattice contact formed from a material associated with at least one of the at least one first, second, and third superconducting signal line.

7. The system of claim 1, wherein the at least one interconnect contact is arranged as a conductive metallic spring to provide pressure between each of the at least one first and third superconducting signal lines and the at least one second and third superconducting signal lines.

8. The system of claim 1, further comprising a pressure fastener configured to provide pressurized contact at the contact point between each of the at least one first and third superconducting signal lines and the at least one second and third superconducting signal lines.

9. The system of claim 1, further comprising at least one pin connector extending through the interconnect structure and each of the first cable and the second cable to provide keyed coupling between each of the at least one first and third superconducting signal lines and the at least second and third superconducting signal lines.

10. The system of claim 1, further comprising a connection base coupled to each of the interconnect structure, the first cable, and the second cable, the connection base being configured to provide keyed coupling between each of the at least one first and third superconducting signal lines and the at least second and third superconducting signal lines.

11. The system of claim 1, wherein the at least one third superconducting signal line comprises a plurality of third superconducting signal lines having a quantity that is greater than each of the at least one first and second superconducting signal lines and having at least one of a cross-sectional width and a spacing between the plurality of third superconducting signal lines that is less than a width of each of the at least one first and second superconducting signal lines.

12. The system of claim 1, wherein the first cable comprises the at least one first superconducting signal line on a first surface and further comprises at least one fourth superconducting signal line on a second surface opposite the first surface, the at least one fourth superconducting signal line being configured to propagate a respective at least one second signal, wherein the second cable comprises the at least one second superconducting signal line on a first surface and further comprises at least one fifth superconducting signal line on a second surface opposite the first surface, the at least one fifth superconducting signal line being configured to propagate the respective at least one second signal, wherein the system further comprises:

a second interconnect structure configured to contact each of the first and second cable and comprising at least one sixth superconducting signal line to propagate the respective at least one second signal between the respective at least one fourth superconducting signal line and the at least one fifth superconducting signal line; and at least one second interconnect contact disposed on at least one of the fourth, fifth, and sixth at least one superconducting signal line at a contact portion between each of the at least one fourth and sixth superconducting signal lines and the at least fifth and sixth superconducting signal lines.

13. A computer interconnect system comprising:

a first cable comprising at least one first superconducting signal line formed from a superconductor material and configured to propagate a respective at least one signal;

a second cable comprising at least one second superconducting signal line formed from the superconductor material and configured to propagate the respective at least one signal;

an interconnect structure comprising at least one keying structural element, the interconnect structure being configured to contact each of the first and second cable in a keyed arrangement based on the at least one keying structural element and comprising at least one third superconducting signal line formed from the superconductor material and configured to propagate the respective at least one signal between the respective at least one first superconducting signal line and the at least one second superconducting signal line; and at least one interconnect contact disposed on at least one of the first and second superconducting signal lines and on the third superconducting signal line at a contact portion between each of the at least one first and third superconducting signal lines and the at least second and third superconducting signal lines.

14. The system of claim 13, further comprising a pressure fastener configured to provide pressurized contact at the contact point between each of the at least one first and third superconducting signal lines and the at least one second and third superconducting signal lines, wherein the at least one interconnect contact comprises at least one conductive metallic layer disposed on each of the at least one first, second, and third superconducting signal line and having a thickness of between approximately 10 nm and approximately 30 nm.

15. The system of claim 13, wherein the at least one interconnect contact is arranged as a nanolattice contact formed from a material associated with at least one of the at least one first, second, and third superconducting signal line.

16. The system of claim 13, wherein the at least one interconnect contact is arranged as a conductive metallic spring to provide pressure between each of the at least one first and third superconducting signal lines and the at least one second and third superconducting signal lines.

* * * * *